United States Patent
Huang et al.

(10) Patent No.: US 7,148,098 B2
(45) Date of Patent: Dec. 12, 2006

(54) SYSTEM AND METHOD OF FORMING A SPLIT-GATE FLASH MEMORY STRUCTURE

(75) Inventors: Shieh Feng Huang, Taoyuan (TW); Jiun Nan Chen, Taipei (TW); Lien Yo Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 10/873,694

(22) Filed: Jun. 22, 2004

(65) Prior Publication Data

US 2005/0280073 A1  Dec. 22, 2005

(51) Int. Cl.
*H01L 21/8238* (2006.01)
*H01L 21/336* (2006.01)
*H01L 21/302* (2006.01)
*H01L 21/461* (2006.01)

(52) U.S. Cl. ............ 438/201; 438/218; 438/257; 438/691

(58) Field of Classification Search ............ 438/201, 438/218, 257, 691
See application file for complete search history.

(56) References Cited

U.S. PATENT DOCUMENTS

2001/0012662 A1   8/2001  Hsieh et al.
2003/0073276 A1*  4/2003  Lin et al. .............. 438/201

OTHER PUBLICATIONS

Stanley Wolf Ph.D. in Silicon Processing for the VLSI Era, vol. 2: Process Integration, Lattice Press, 1990, p. 194.*
Rebecca Mih et al., "0.18 um Modular Triple Self-Aligned Embedded Split-gate Flash Memory", 2000 Symposium on VLSI Technology Digest of Technical Papers, pp. 120-121.

* cited by examiner

*Primary Examiner*—William M. Brewster
(74) *Attorney, Agent, or Firm*—Haynes and Boone, LLP (57) ABSTRACT

A method for forming a split-gate flash memory structure includes etching a first gate layer to form one or more floating gates and forming an isolation layer over the floating gates. An insulation layer is deposited over the isolation layer and planarized.

18 Claims, 14 Drawing Sheets

SYSTEM AND METHOD OF FORMING A SPLIT-GATE FLASH MEMORY STRUCTURE

BACKGROUND

Memory devices such as electrically erasable and programmable read-only memories (EEPROMs) and flash electrically erasable and electrically programmable read-only memories (flash EEPROMs) often include functions of electrical programming and erasing. To perform such functions, these memory devices often include either a stacked-gate structure or a split-gate structure.

One of the shortcomings of the stacked-gate structure is the "over-erasure" of the cell contents during erase operations. When erasing memory content, the erase operation is normally sustained for a slightly prolonged time period to ensure complete removal of the electrons previously injected. However, sometimes such a prolonged erase operation results in the removal of excess electrons. As a result, electron holes may form in the floating gate of the device. In severe cases, the stacked-gate transistor may become a depletion transistor, which conducts even in the absence of a control voltage at the control gate.

Split-gate devices are often used to overcome the memory over-erasure shortcoming of stacked-gate devices. Typically, such a device includes a transistor that includes a control gate and a floating gate. The principal advantage of such a configuration is that the transistor is not affected by the state of the floating gate. Instead, the memory transistor remains in its off state, even if the floating-gate is subject to the phenomenon of over-erasure and therefore is in a conductive state. Accordingly, the transistor can maintain its correct state irrespective of the over-erasure condition.

With the advancement of fabrication processes and materials, semiconductor device geometries have continued to decrease. For example, currently, fabrication facilities are producing devices with geometry sizes (e.g., the smallest component or line that may be created using the process) of less than 90 nm. However, the reduction of geometrical sizes frequently introduces new challenges. For example, size reduction of the devices calls for decreased sizes of flash memory cells. However, significant size reduction of flash memory cells may not be achieved pursuant to previously available methods.

Therefore, it is desired to provide an improved system and method of forming split-gate flash memory structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present invention relates generally to the manufacturing of semiconductor devices, and more particularly to a system and method of forming a split-gate flash memory structure.

For the purposes of promoting an understanding of the principles of the invention, references will now be made to the embodiments, or examples, illustrated in the drawings and specific languages will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 1:
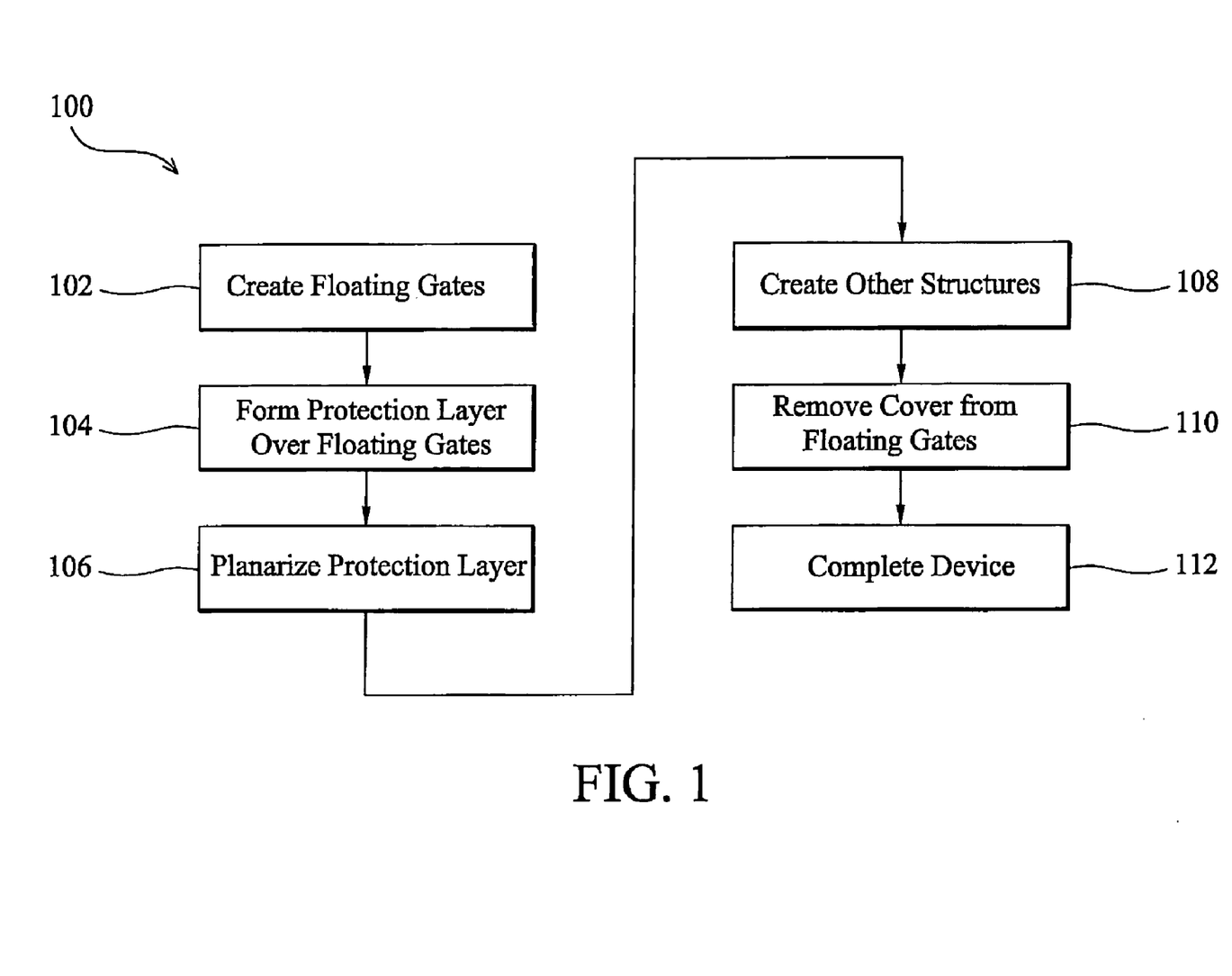
FIG. 1 is a flowchart of a simplified processing method for implementing one or more embodiments of the present invention.

Referring now to FIG. 1, a method 100 can be performed to create a semiconductor device according to embodiments of the present invention. It is understood that the method 100 is simplified, and additional steps may be performed before, during, or after the method. The method 100 will be discuss briefly below, and then a more detailed example of the method will be described with reference to FIGS. 2–10, below.

Execution begins at step 102, in which a first pair of floating gates are created for a microelectronic device. At step 104, the floating gates are covered with one or more protection layers. At step 106, the protection layer(s) can be planarized, such as by chemical mechanical polishing. At step 108, isolation regions are created for the microelectronic device. One example of an isolation region would be a shallow trench isolation (STI). At step 110, the protection layer(s) are removed, thereby partially or fully re-exposing the floating gates. At step 112, insulating layers, control gates, source/drain regions, and/or other structures are formed to complete creation of the microelectronic device.

Figure 2:
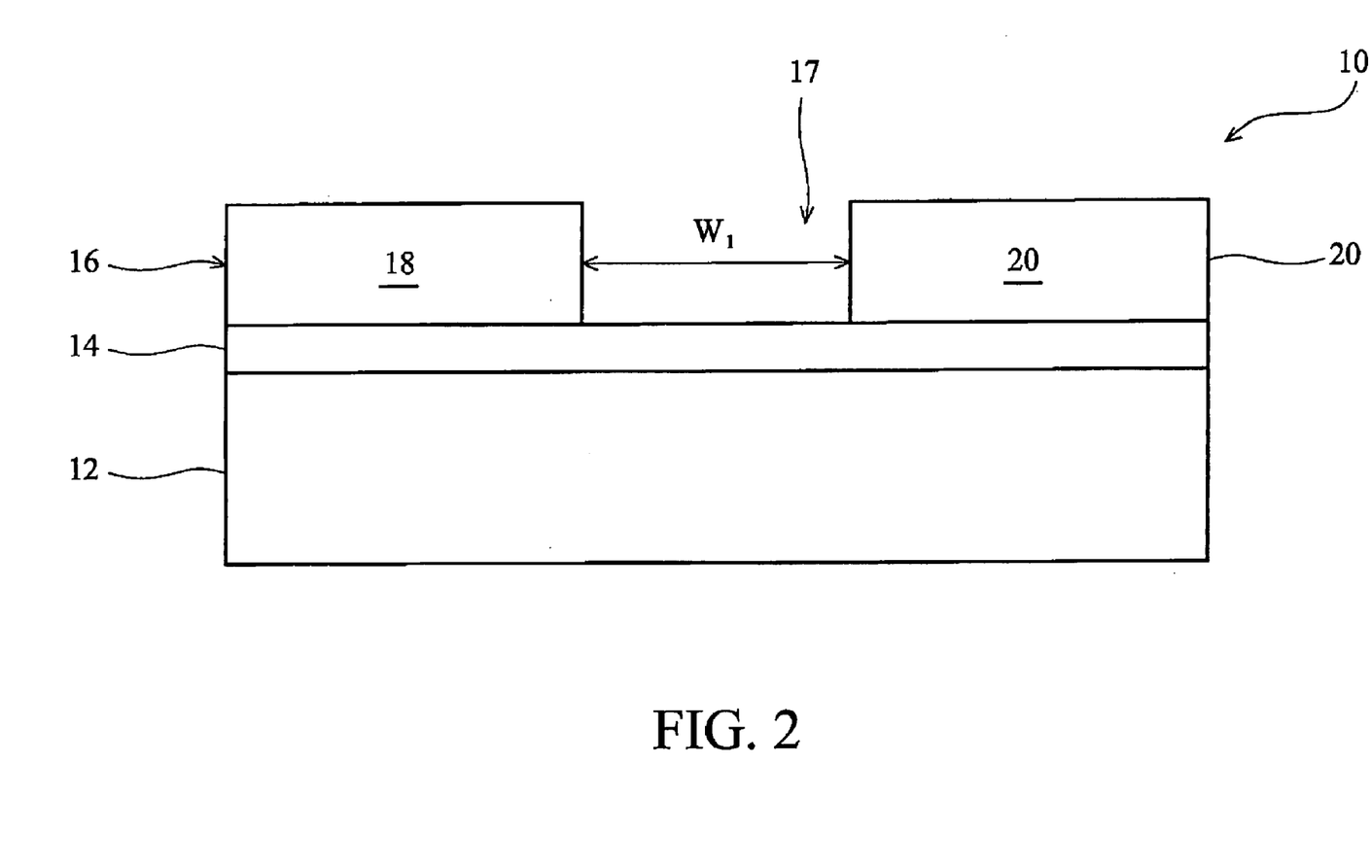
FIGS. 2–10 illustrate cross-sectional views of a semiconductor device being processed according to various embodiments of the present disclosure

Referring now to FIG. 2, shown therein is a cross-sectional view of a semiconductor device 10 upon which one or more embodiments of the method 100 of FIG. 1 can be implemented. The semiconductor device 10 includes a substrate 12, an oxide layer 14, and a silicon nitride layer 16 according to one embodiment of the present disclosure. The substrate 12 may be a single crystal or other silicon substrate, a silicon-on-insulator (SOI) substrate including a silicon or germanium epitaxial layer on a silicon or sapphire substrate, a plastic or other flexible substrate, or other conventional or future-developed substrates. The substrate 12 may be or include a contact to a semiconductor device or interconnect. For example, the substrate 12 may be or include a semiconductor wafer or other layers formed on a semiconductor substrate.

In furtherance of the example, the oxide layer 14 may include $SiO_2$, $Ta_2O_5$, $Hf_2O$, $ZrO_2$ or other dielectric materials to provide a desired oxide thickness, and may be formed by atomic layer deposition (ALD), chemical vapor deposition (CVD), physical vapor deposition (PVD), thermal or rapid-thermal-processing (RTP) oxidation, in-situ steam generation (ISSG) RTP oxidation, or other methods. In one example, the oxide layer 14 may be formed thermally in dry oxygen and an oxidation furnace at a temperature of approximately between 650° C. and 950° C., and to a desired thickness. The oxide layer 14 may have an approximate thickness of between 40 Angstroms and 140 Angstroms. However, other temperatures and thicknesses are also contemplated.

In this example, a dielectric layer 16, which may include silicon nitride, silicon oxynitride, silicon carbide or other suitable materials, may be formed on the oxide layer 14 by ALD, CVD, PVD, RTP, or other methods. In one example, the dielectric layer 16 may be deposited on the oxide layer 14 at a temperature of approximately between 630° C. and 940° C., and to a desired thickness of approximately between 3000 Angstroms and 5000 Angstroms. However, other temperatures and thicknesses are also contemplated.

The dielectric layer 16 is etched to create a defined area 17 between dielectric layer components 18 and 20. The area 17 may be formed by etching of the dielectric layer 16 using a patterned mask. It is understood that many techniques for forming openings in dielectric layers are known in the art, and will not be further described herein. The area 17 may include a width w1 of approximately between 0.41 micrometer and 0.71 micrometer. However, a larger or smaller width is also contemplated by the present disclosure.

Figure 3A:
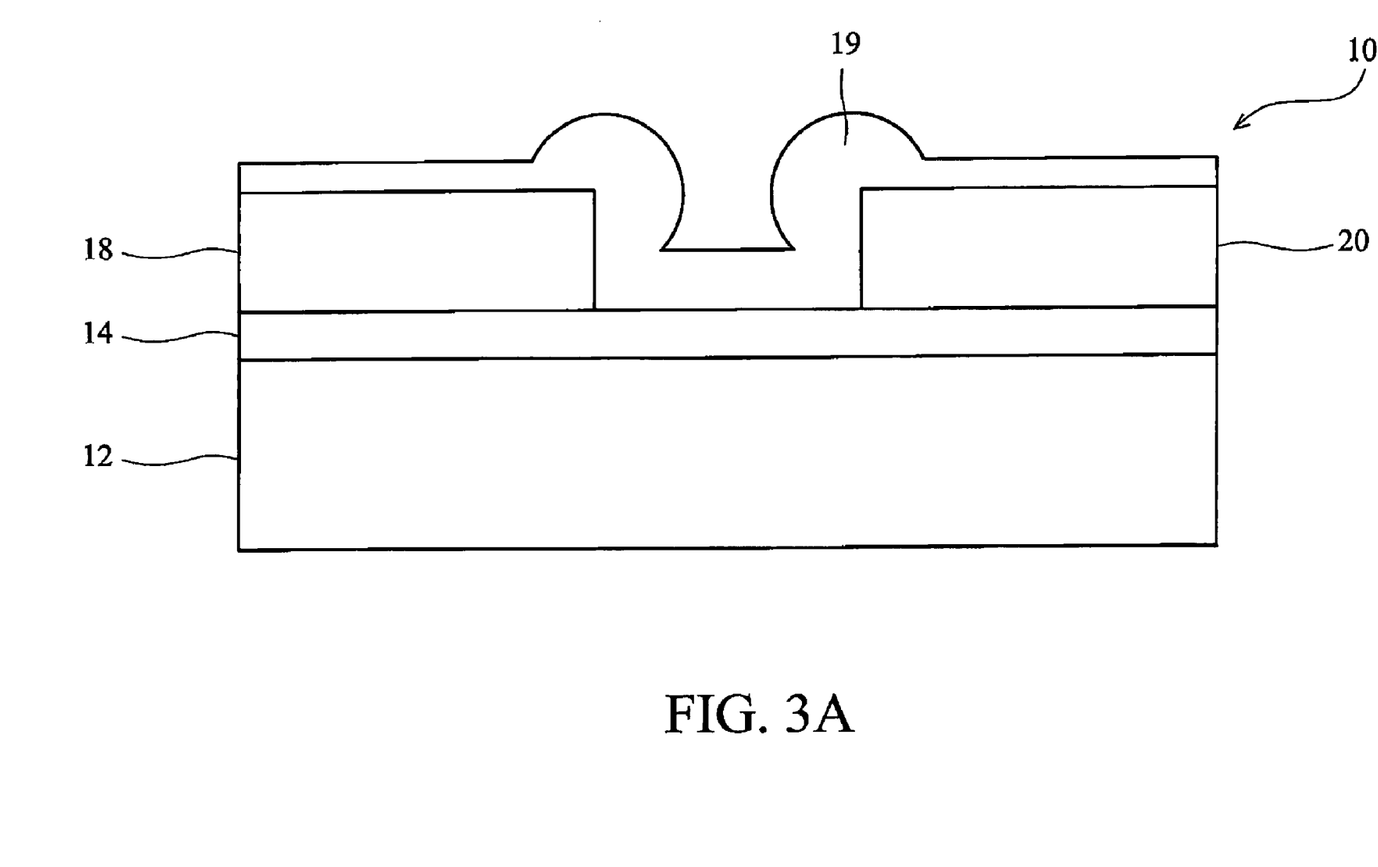

Referring now to FIG. 3A, the semiconductor device 10 includes a first gate layer 19 according to one embodiment of the present disclosure. In this embodiment, the first gate layer 19 may include polycrystalline silicon, and may be formed through a variety of methods, including but not limited to, CVD, PVD, or ALD. In one example, the first gate layer 19 may be formed at approximately between 470° C. and 780° C., and to a thickness of approximately between 800 Angstroms and 1200 Angstroms. However, other temperatures and thicknesses are also contemplated for forming the first gate layer 19. Further, conductive materials, such as Cu, Al, Ni, Co, metal silicide, metal oxide, metal, or tungsten silicide; or other suitable materials, may be used to replace the polycrystalline silicon material for the first gate layer 19.

Figure 3B:
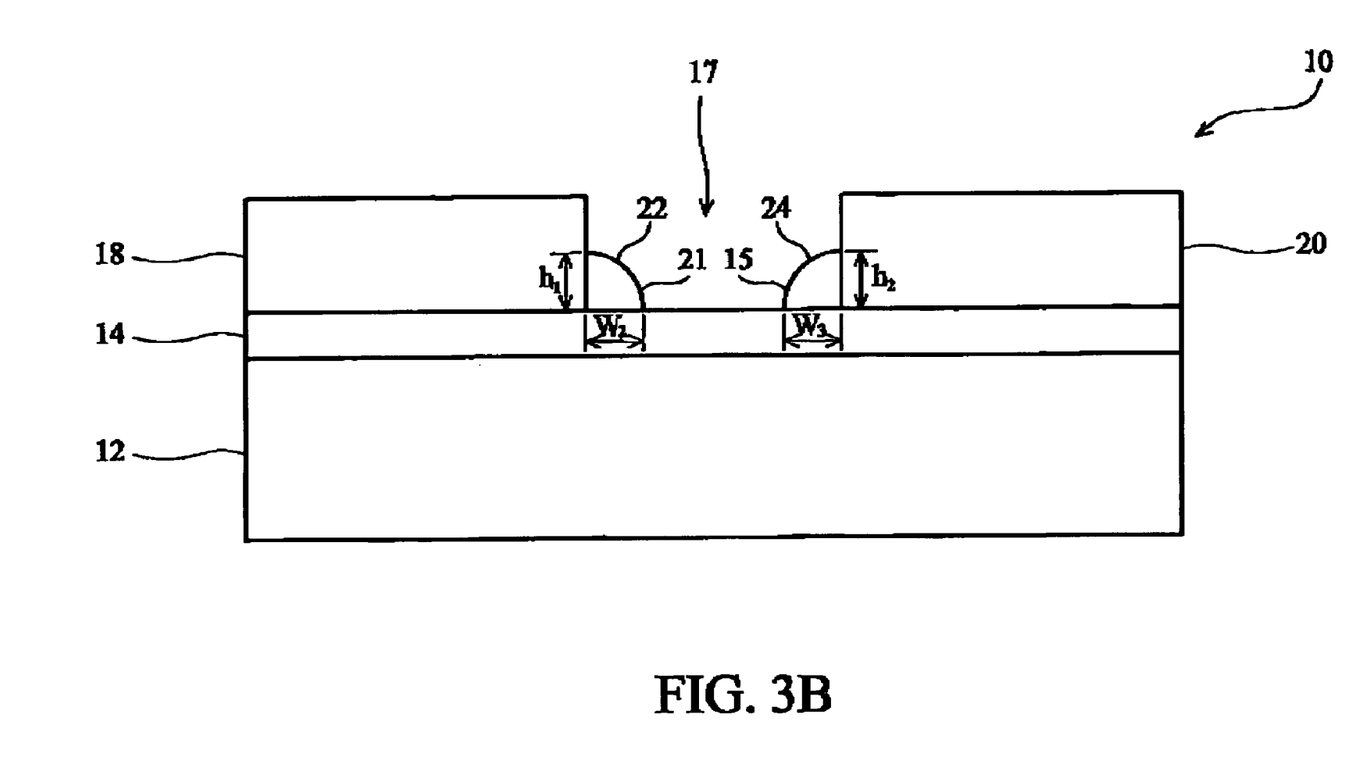

Referring now to FIG. 3B, floating gates 22 and 24 are then formed in the defined area 17. In this embodiment, etching, which may include dry etching, chemical etching or other processes, may be performed on the first gate layer 19 of FIG. 3A to form the floating gates 22 and 24. The floating gates 22 and 24 may include a variety of shapes and sizes. In one example, each of the widths w2 and w3 of the floating gates 22 and 24 may be approximately between 0.13 micrometer and 0.23 micrometer. However, it is also contemplated that each of the widths w2 and w3 may be smaller than 0.13 micrometer or larger than 0.23 micrometer. Further, even though the width w2 is shown to be equal to the width w3, it is also contemplated that the width w2 may differ from the width w3.

In another example, each of the heights h1 and h2 of the floating gates 22 and 24 may be less than 5000 Angstroms. However, it is also contemplated that each of the heights h1 and h2 may be equal to or larger than 5000 Angstroms. In this illustration, the height h1 is shown to be equal to the height h2. However, it is also contemplated that h1 may differ from h2. Although the floating gates 22 and 24 are shown to possess partial circular side walls 21 and 15, it is also contemplated that the side walls 21 and 15 may include other regular or irregular shapes. Therefore, a great number of variations are contemplated for the floating gates 22 and 24.

Figure 3C:
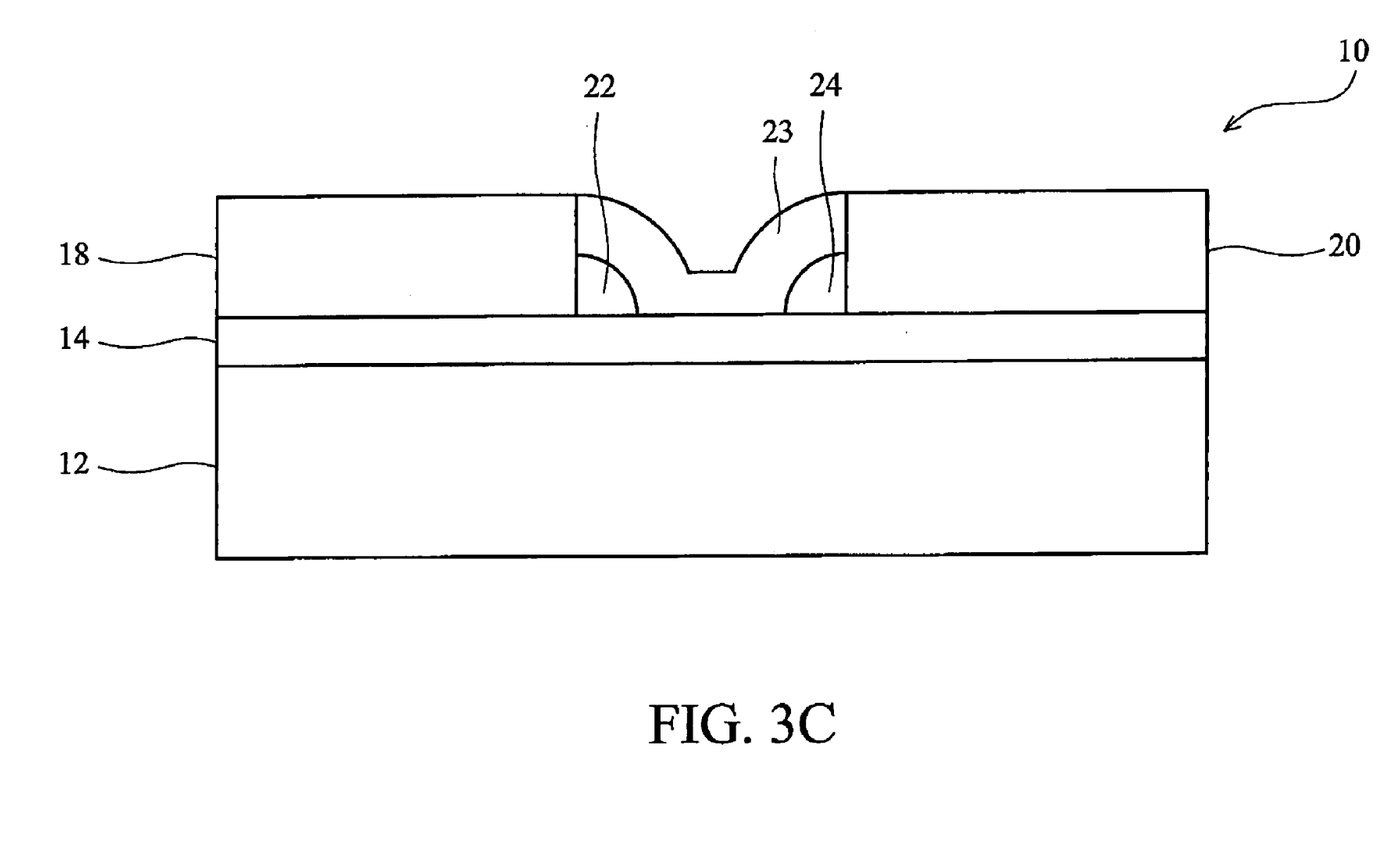

Referring now to FIG. 3C, an isolation layer 23 is formed over the floating gates 22, 24. The isolation layer 23 may be utilized to protect the floating gates 22 and 24 from a shallow trench isolation (STI) scheme discussed below. In this embodiment, the isolation layer 23 may include poly-oxides, $SiO_2$, $Ta_2O_5$, $Hf_2O$, $ZrO_2$ or other dielectric materials to provide a desired oxide thickness, and may be formed by ALD, CVD, PVD, RTP oxidation, ISSG RTP oxidation, or other methods. In one example, the isolation layer 23 may be formed thermally in dry oxygen and an oxidation furnace at a temperature of approximately between 700° C. and 900° C., and to a desired thickness of about between 100 Angstroms and 300 Angstroms. However, other temperatures and thicknesses are also contemplated by the present disclosure.

Figure 3D:
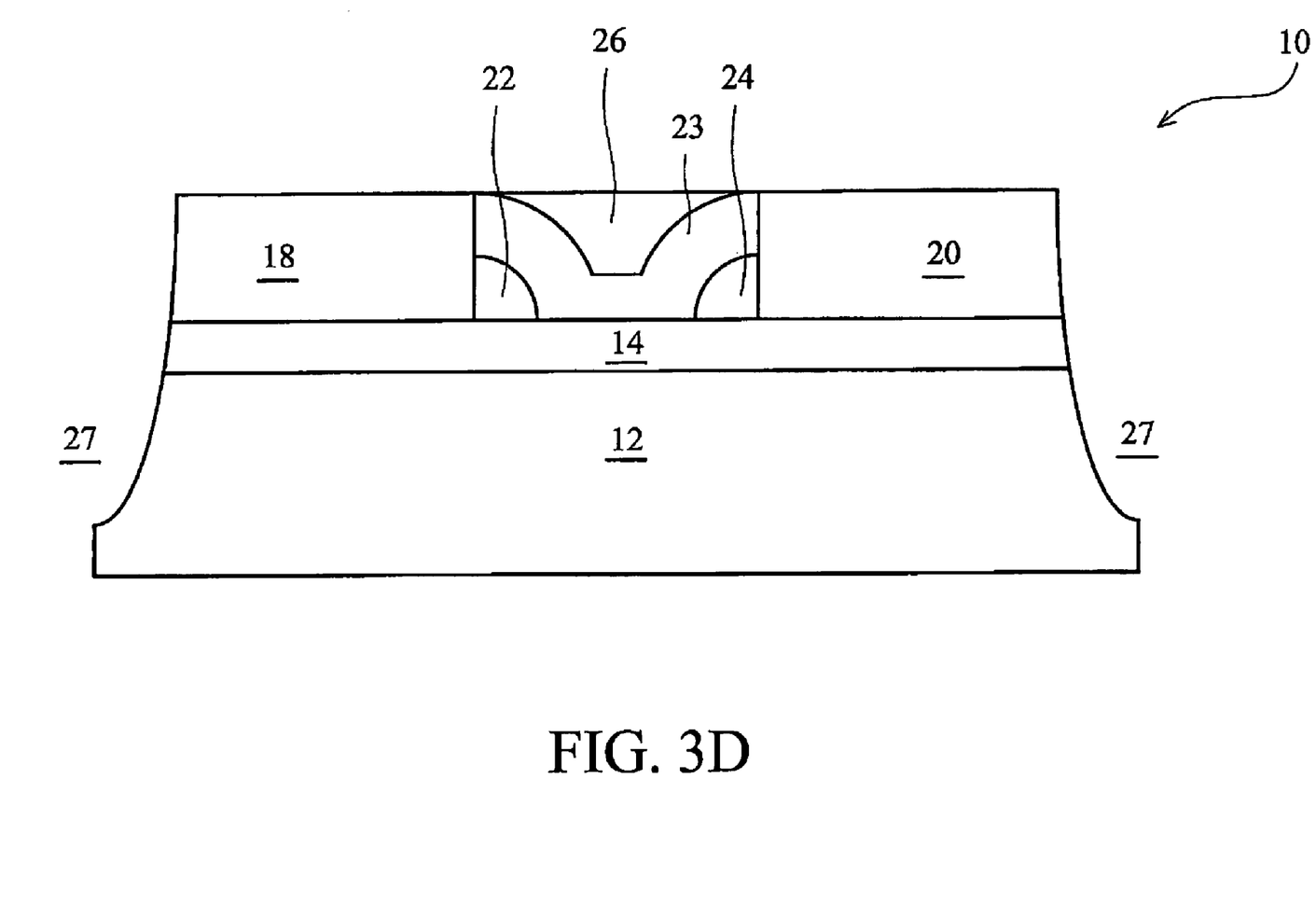

Referring now to FIG. 3D, the semiconductor device 10 further includes an insulation layer 26 over the isolation layer 23. The insulation layer 26 may include tetha ethyl ortho silicate (TEOS), polyimide, porous silica, other proper low-k materials, or any other suitable materials. It may be formed by CVD, PVD, Spin-on, or other methods. In one example, an original insulation layer may be deposited at a temperature of approximately between 550° C. and 850° C., and to a desired thickness of about between 2000 Angstroms and 4000 Angstroms. Following the deposition, chemical mechanical polishing may be applied to the original insulation layer to form the insulation layer 26. In the present embodiment, any insulation layer over the dielectric layers 18, 20 is removed, although this is not required. It is understood that chemical mechanical polishing is known in the art, and will not be further described herein.

In furtherance of the example, an isolation scheme may be applied to one or more other parts of the semiconductor device 10. For the sake of example, two STIs 27 are formed in the substrate 12. Other examples of isolation include local oxidation of silicon (LOCOS), and/or other electrical isolation features Referring to FIG. 4A, once the isolation scheme has been implemented, one or both of the insulation layers 26 and 23 of FIG. 3D are etched to expose floating gates 22a, 24a. The floating gates 22a, 24a are similar to the floating gates 22, 24 of FIG. 3B, except that they have gone through the above-described processing. For example, even though the isolation layer 23 has been removed, it is noted that some residue of the isolation layer 23 (not shown) may remain on or over the surfaces 22a and 24b.

Figure 4A:
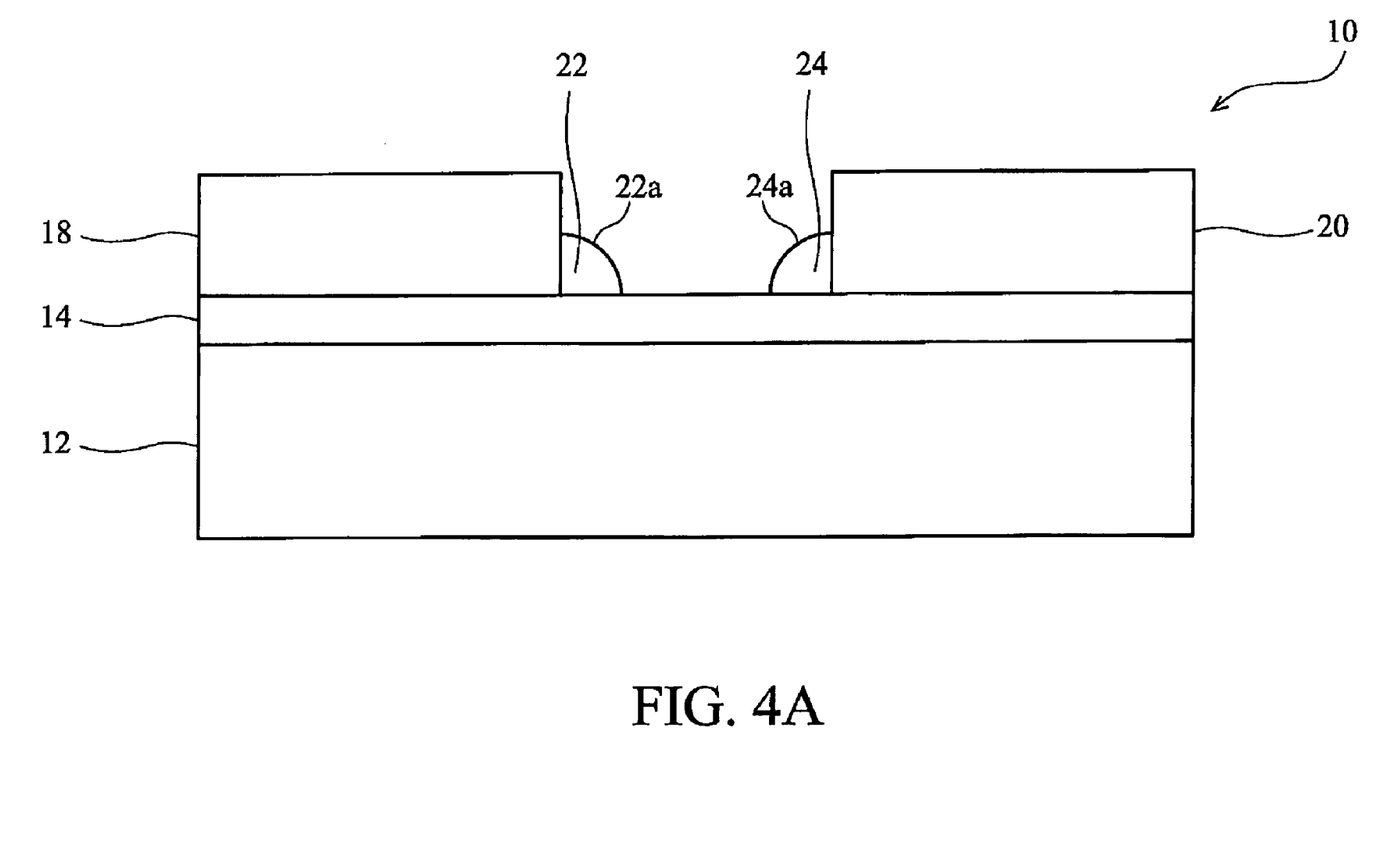
Figure 4B:
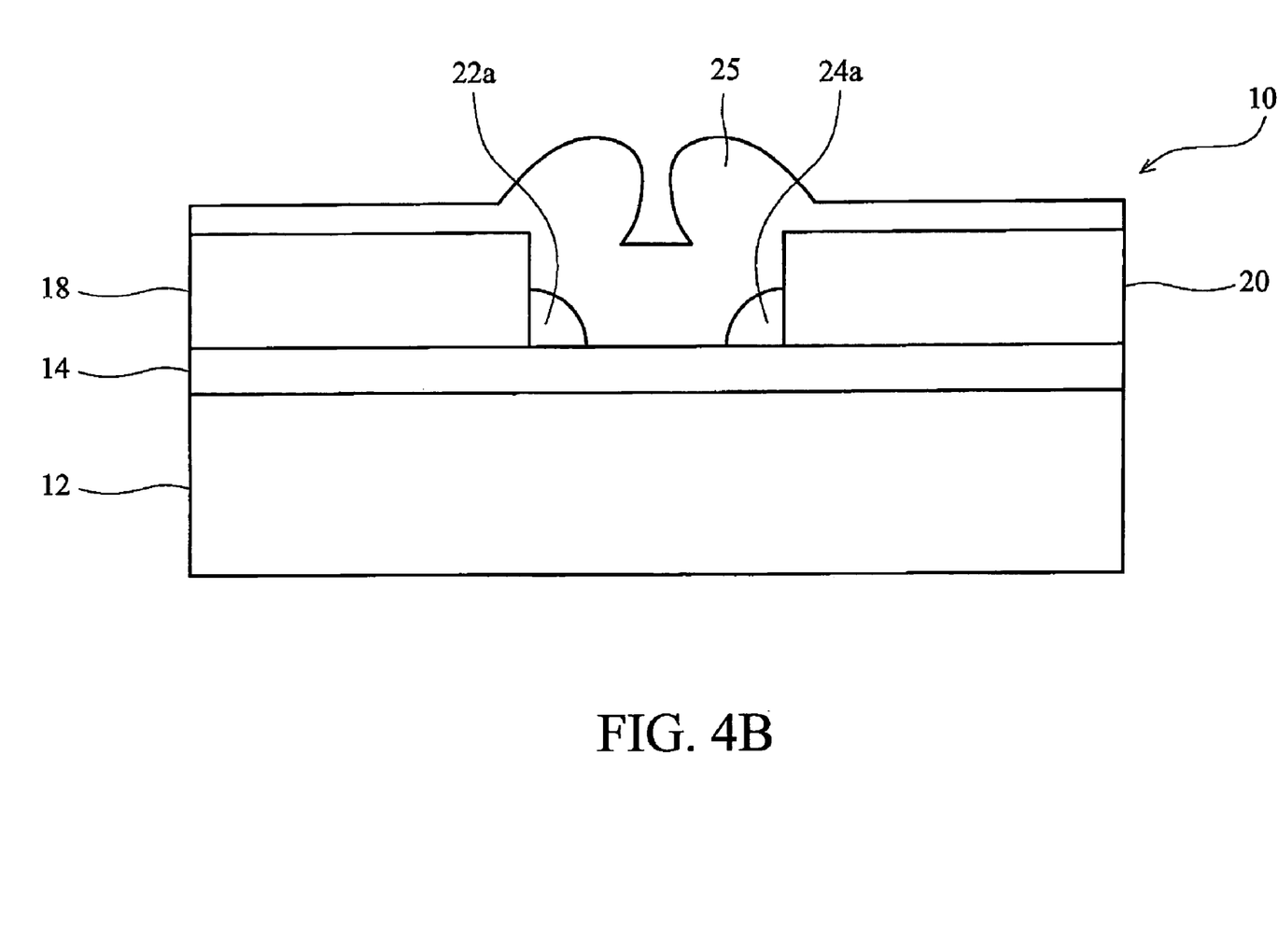

Referring now to FIG. 4B, an insulation layer 25 is formed over and floating gates 22a and 24a. In this embodiment, the insulation layer 25 may include TEOS, polyimide, porous silica, low-k materials, or any suitable materials, and may be formed by CVD, PVD, spin-on, or other methods. In one example, the insulation layer 25 may be deposited at a temperature of approximately between 550° C. and 850° C., and to a desired thickness of about between 2000 Angstroms and 4000 Angstroms. However, other temperatures and thicknesses are also contemplated by the present disclosure.

Figure 5:
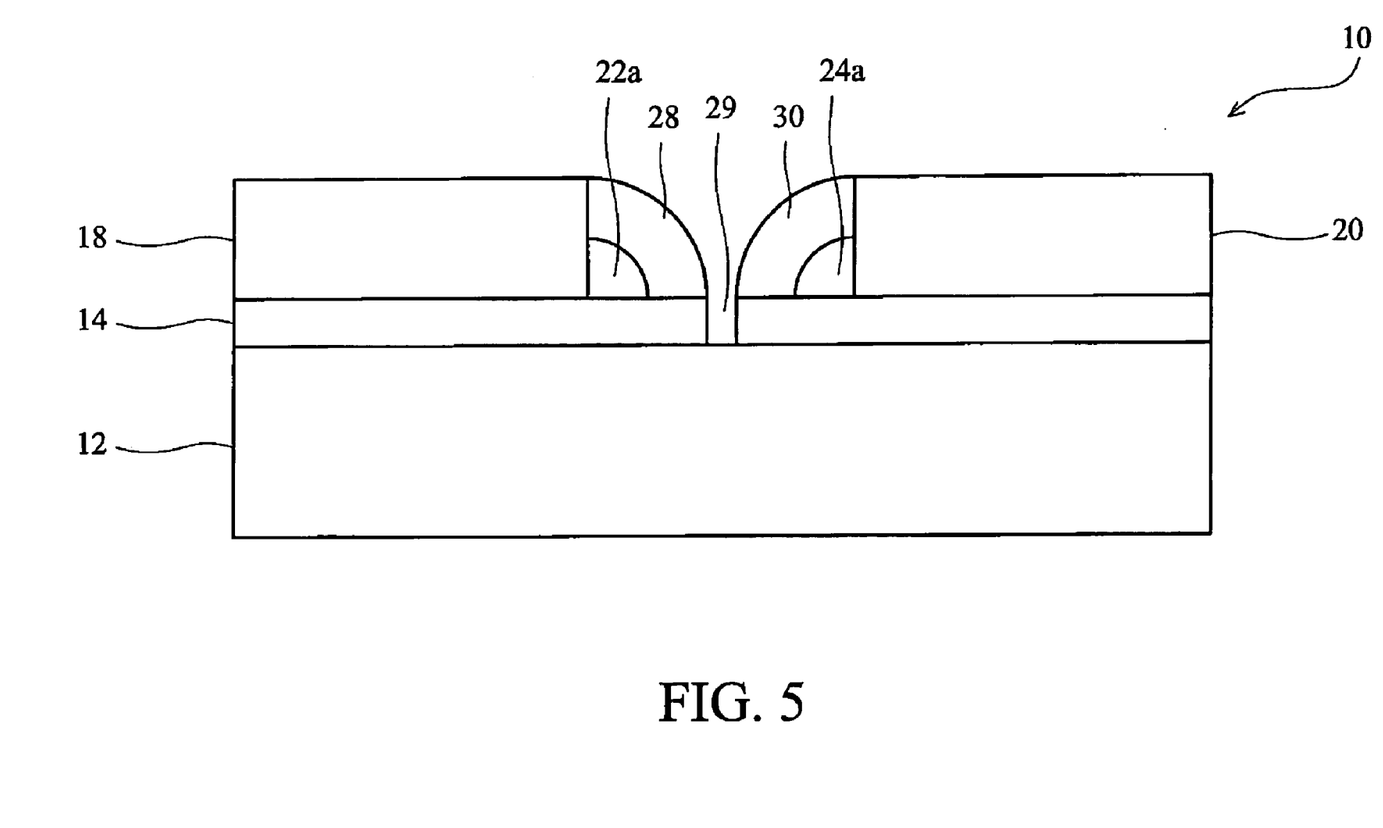

Referring now to FIG. 5, insulation spacers 28 and 30 are formed over floating gates 22a and 24a, respectively. In this embodiment, etching, which may include dry etching, chemical etching, or other suitable processes, may be applied to the insulation layer 25 of FIG. 4B to form the spacers 28 and 30. Furthermore, in the present embodiment, the etching also can create a space 29 in the oxide layer 14.

Figure 6:
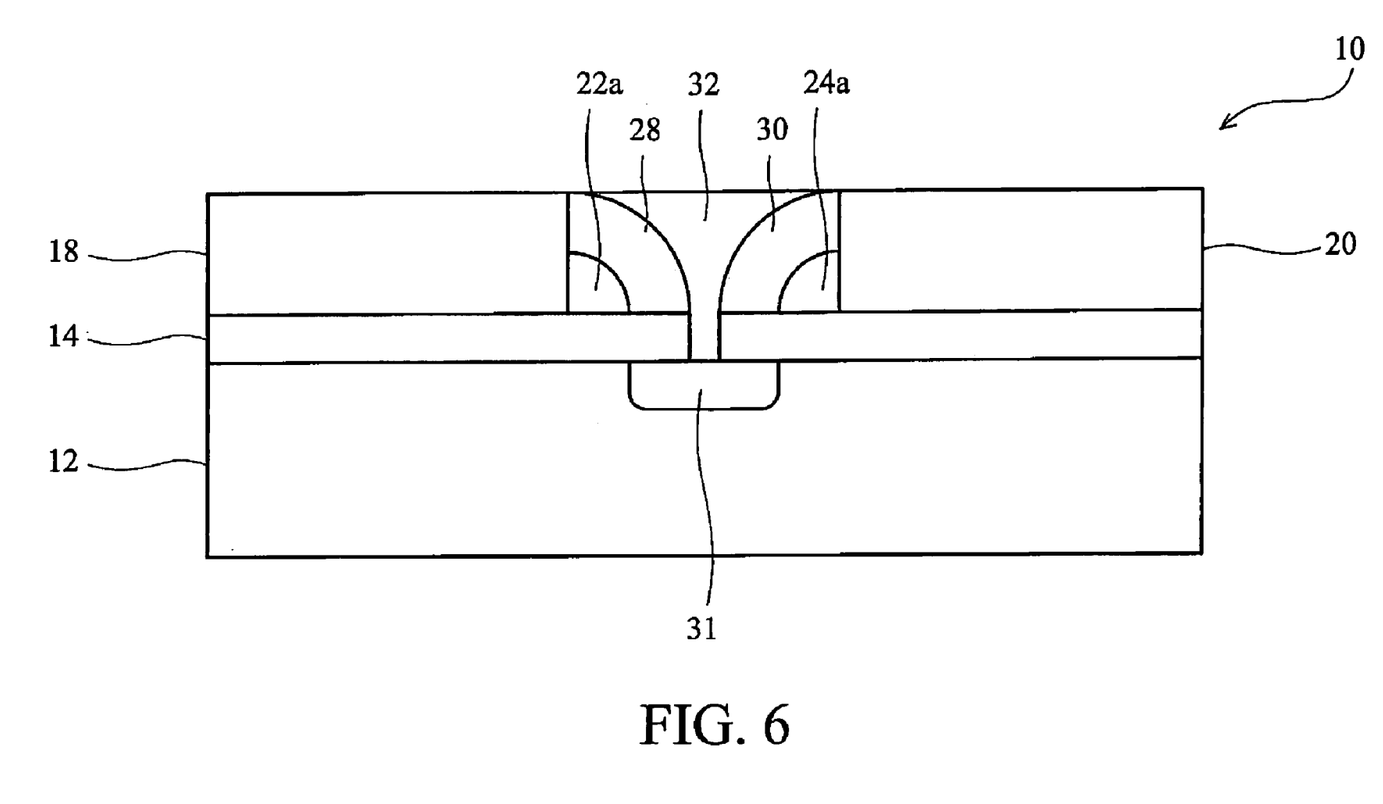

Referring now to FIG. 6, a source implant 31 and a polycrystalline silicon layer 32 are formed on the semiconductor device 10. In this embodiment, the source implant region 31 may be formed by diffusion or any conventional method known in the art. In some embodiments, the source implant region 31 can be performed earlier in the process.

In one embodiment, the polycrystalline silicon layer 32 is formed by creating an overlying polycrystalline silicon layer through a variety of methods, including but not limited to, CVD, PVD, ALD, or other methods. In one example, the polycrystalline silicon layer may be formed at approximately between 380° C. and 680° C., and to a thickness of approximately between 3500 Angstroms and 5500 Angstroms. However, other temperatures and thicknesses are also contemplated for forming the polycrystalline silicon layer. The polycrystalline silicon material may be doped or undoped, and any other suitable materials, such as Cu, Al, Ni, Co, metal silicide, fungsten, silicide, and/or other materials may be used to replace the polycrystalline silicon material. Thereafter, chemical mechanical polishing and/or etching, which may include dry etching, chemical etching, and other processes, may be applied to form the polycrystalline silicon layer 32.

Figure 7:
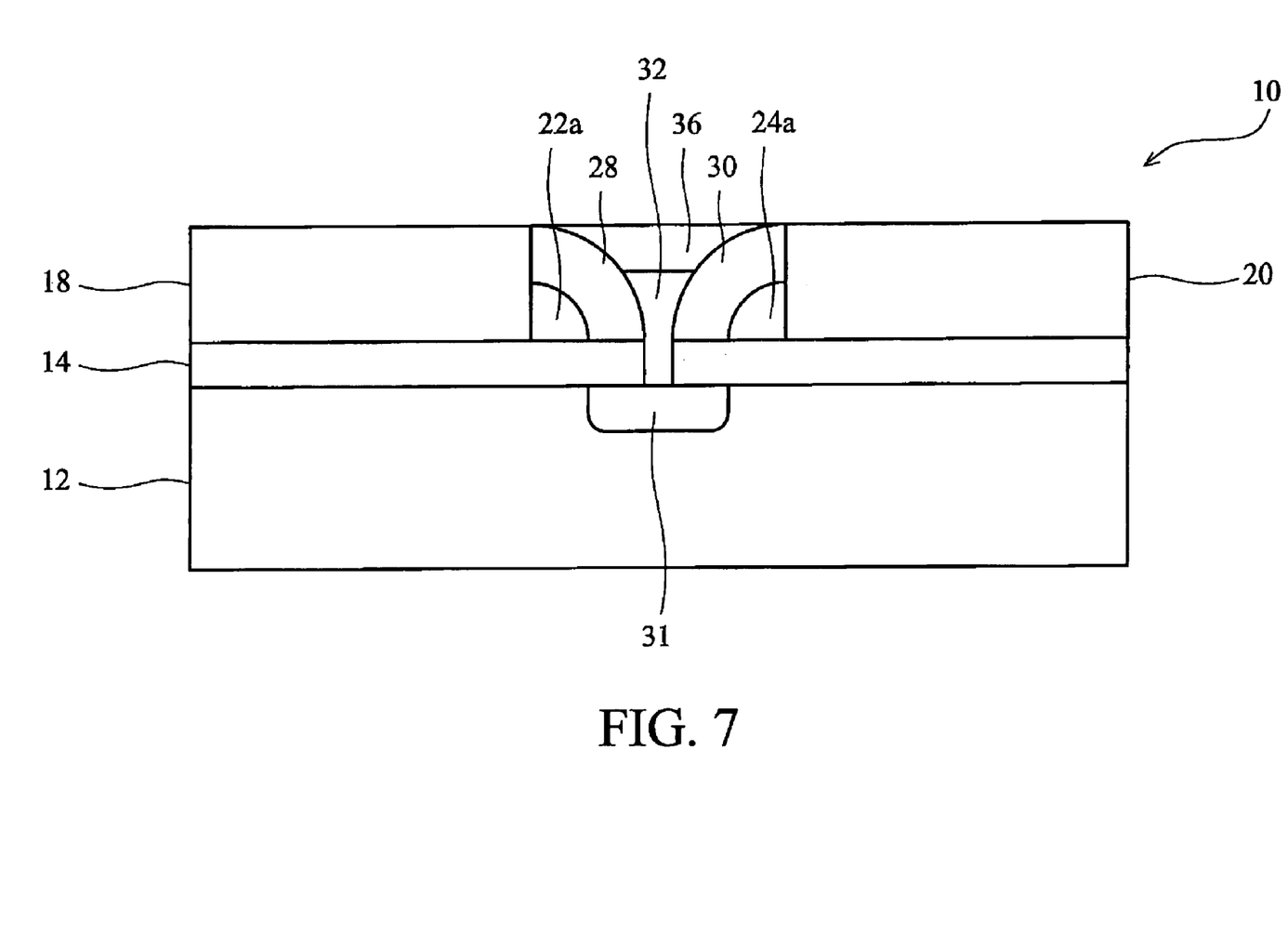

Referring now to FIG. 7, an oxide layer 36 is then formed over the polycrystalline silicon layer 32. In this embodiment, the oxide layer 36 may include $SiO_2$, $Ta_2O_5$, $Hf_2O$, $ZrO_2$ or other dielectric materials to provide a desired oxide thickness, and may be formed by ALD, CVD, PVD, RTP, or other methods. In one example, the oxide layer 36 may be formed thermally in dry oxygen and an oxidation furnace at a temperature of approximately between 700° C. and 900° C., and to a thickness of about between 50 Angstroms and 150 Angstroms. However, other temperatures and thickness are also contemplated.

Figure 8:
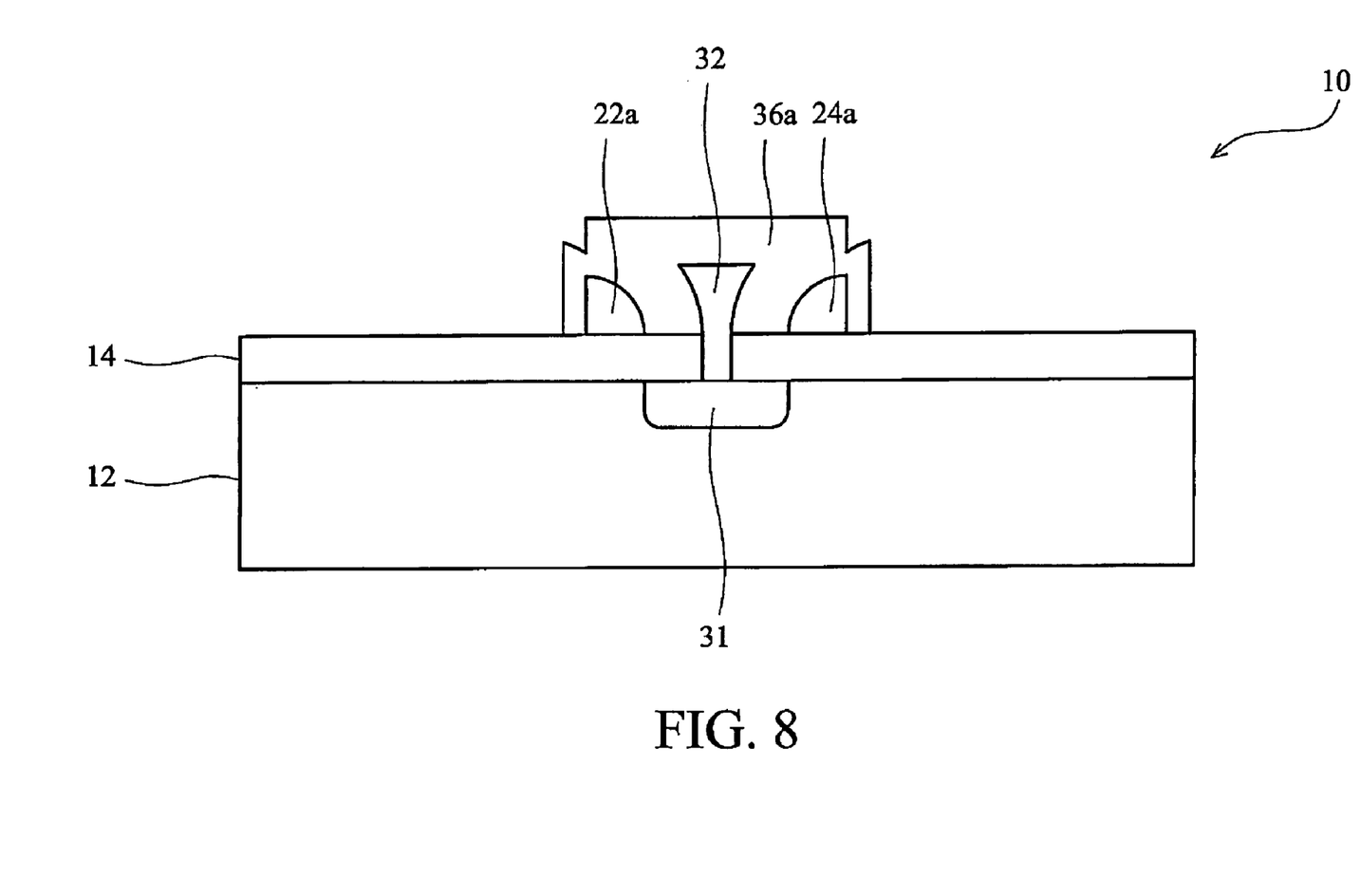

Referring now to FIG. 8, the dielectric layer components 18 and 20 of FIG. 7 may be stripped by methods known in the art. Then, high temperature oxide (HTO) and inter-poly oxide (IPO), both of which are known in the art, may be applied at approximately between 600° C. and 1000° C., and to a thickness of about between 100 Angstroms and 205 Angstroms to further refine the semiconductor device. Insulation spacers 28, 30 and oxide layer 36, collectively referred to as layer 36a, eventually form a layer around the floating gates 22a and 24a and the polycrystalline silicon layer 32.

Figure 9:
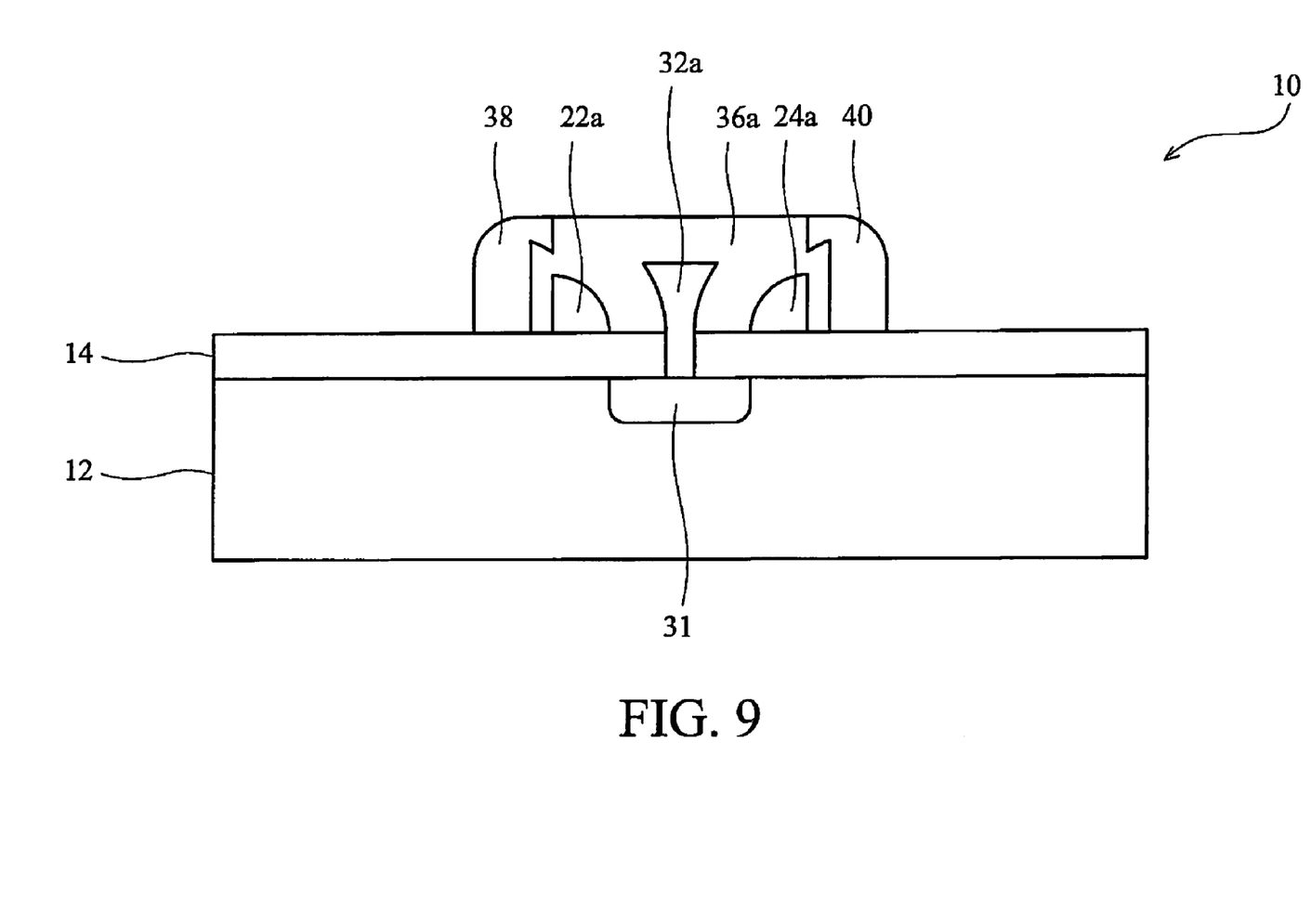

Referring now to FIG. 9, control gates 38 and 40 are then formed on the semiconductor device 10. In one embodiment, a polycrystalline silicon layer may be formed over the device 10 through a variety of methods, including but not limited to, CVD, PVD, ALD, or other methods. In one example, the polycrystalline silicon layer may be formed at approximately between 420° C. and 820° C., and to a thickness of approximately between 1000 Angstroms and 2200 Angstroms. However, other temperatures and thicknesses are also contemplated for forming the polycrystalline silicon layer. The polycrystalline silicon material may be replaced by any other suitable materials, such as Cu, Al, Ni, Co, metal silicide, tungsten, silicide or other materials. Once formed, the polycrystalline silicon layer is etched, which may include dry etching, chemical etching, or other processes, to form the control gates 38 and 40 as shown in FIG. 9.

Figure 10:
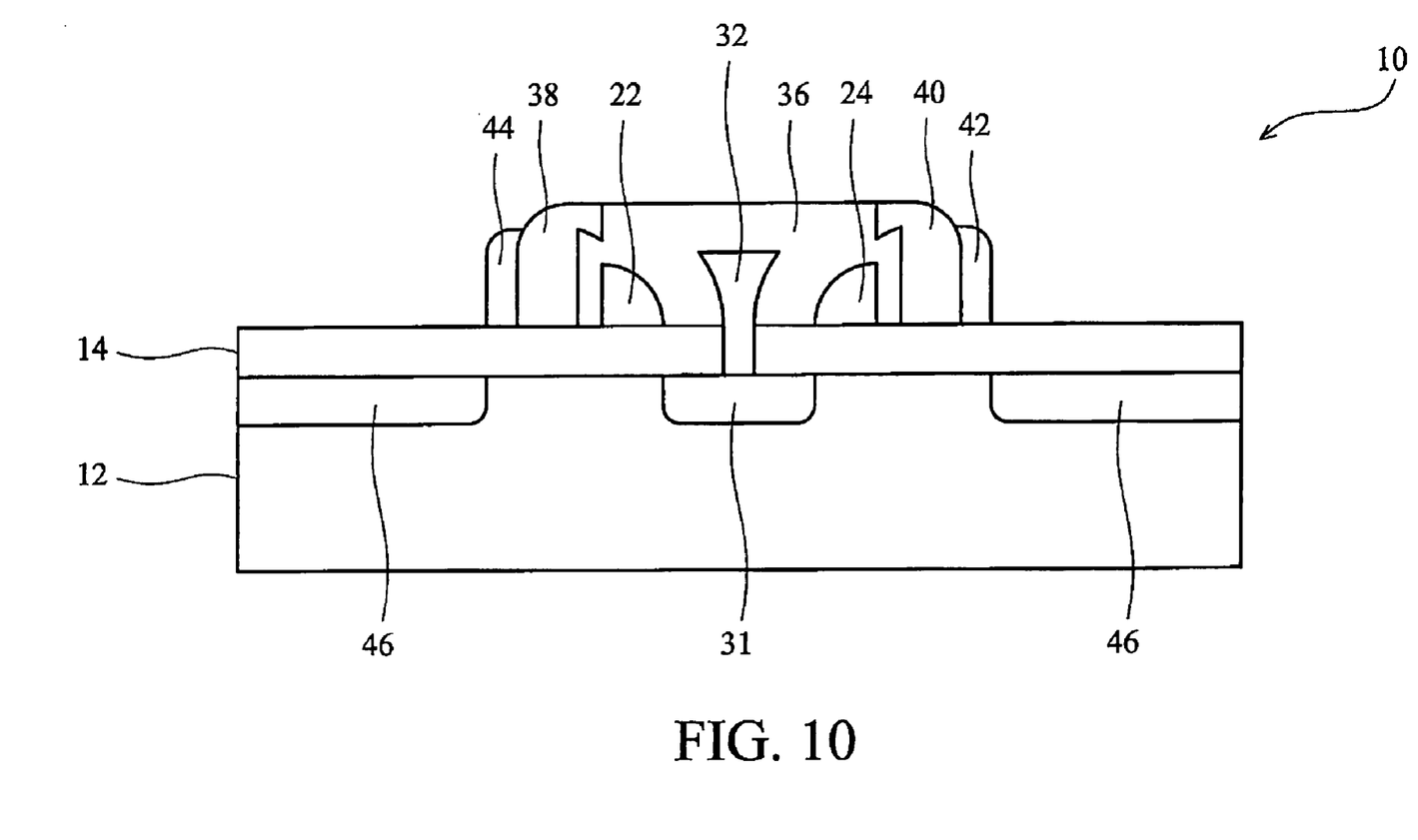

Referring now to FIG. 10, in furtherance of the example and according to methods known in the art, a lateral diffusion drain (LDD) may be implanted, spacers 42 and 44 may be formed, and source and drain regions 46 and 48 may be implanted in the semiconductor device 10. As a result, a completed device is thereby formed. In some embodiments, a resulting cell size using the semiconductor device 10 is significantly lower than that of the prior art.

Although only a few exemplary embodiments of this invention have been described in detail above, those skilled in the art will readily appreciate that many modifications are possible in the exemplary embodiments without materially departing from the novel teachings and advantages of this invention. Also, features illustrated and discussed above with respect to some embodiments can be combined with features illustrated and discussed above with respect to other embodiments. Accordingly, all such modifications are intended to be included within the scope of this invention.

What is claimed is:

1. A method for forming a split-gate flash memory structure, comprising:
   etching a first gate layer to form one or more floating gates;
   forming an isolation layer over the one or more floating gates and a portion of an oxide layer deposited over a substrate;
   forming an insulation layer over the isolation layer, wherein an upper surface of the insulation layer and both ends of the isolation layer are coplanar with an upper surface of a dielectric layer deposited over the oxide layer; and
   removing at least a portion of the isolation layer and the insulation layer to expose the one or more floating gates.

2. A method for forming a split-gate flash memory structure, comprising:
   etching a first gate layer to form one or more floating gates;
   forming an isolation layer over the one or more floating gates;
   forming an insulation layer over the isolation layer;
   removing at least a portion of the isolation layer and the insulation layer; and
   creating one or more shallow trench isolations (STI) between forming and removing the isolation and insulation layers.

3. The method of claim 2 wherein the isolation layer comprises polyoxides.

4. The method of claim 2 further comprising:
   depositing the first gate layer over dielectric layer components and an oxide layer prior to the etching.

5. The method of claim 2 wherein the etching comprises dry etching.

6. The method of claim 2 wherein the first gate layer comprises polycrystalline silicon.

7. The method of claim 2 wherein at least one of the one or more floating gates comprises a partial circular side wall.

8. The method of claim 2 wherein at least one of the one or more floating gates comprises a width of approximately 0.18 micrometer.

9. The method of claim 2 wherein at least one of the one or more floating gates comprises a height of approximately 4000 Angstroms.

10. A method for making a split-gate device, comprising:
    creating a pair of floating gates over an oxide layer deposited over a substrate;
    forming a protection layer of the floating gates, wherein the protection layer comprises an isolation layer and an insulation layer, and wherein an upper surface of the insulation layer and both ends of the isolation layer are coplanar with an upper surface of a dielectric layer deposited over the oxide layer;
    creating an isolation structure in the substrate;
    removing the protection layer after creation of the isolation structure to expose the pair of floating gates; and
    completing the split-gate device after the removal of the protection layer.

11. The method of claim 10 wherein the isolation structure is a shallow trench isolation.

12. The method of claim 10 wherein the step of completing the split-gate device includes forming an insulation layer over the floating gates and providing at least one control gate.

13. The method of claim 10 wherein the insulation layer includes a low dielectric constant material.

14. The method of claim 13 wherein the insulation layer includes tetha ethyl ortho silicate (TEOS).

15. The method of claim 13 wherein the isolation layer includes a dielectric material.

16. A method for forming a split-gate flash memory cell, comprising:
   etching a first gate layer to form one or more floating gates wherein the etching comprises dry etching;
   forming an isolation layer over the one or more floating gates to protect them from a subsequent shallow trench isolation (STI) process, wherein the isolation layer comprises polyoxides;
   depositing a first tetha ethyl ortho silicate (TEOS) layer over the isolation layer; chemical mechanical polishing the first TEOS layer;
   applying the STI process;
   etching the first TEOS layer;
   depositing a second TEOS layer; and
   etching the second TEOS layer to form one or more insulation spacers for the one or more floating gates.

17. The method of claim 16 wherein the one or more floating gates include two floating gates.

18. The method of claim 16 wherein the one or more insulation spacers include two insulation spacers.

* * * * *